(12) United States Patent
Freeman et al.

(10) Patent No.: US 7,858,144 B2
(45) Date of Patent: *Dec. 28, 2010

(54) PROCESS FOR DEPOSITING ORGANIC MATERIALS

(75) Inventors: Diane C. Freeman, Pittsford, NY (US); David H. Levy, Rochester, NY (US); Peter J. Cowdery-Corvan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 618 days.

This patent is subject to a terminal disclaimer.

(21) Appl. No.: 11/861,618

(22) Filed: Sep. 26, 2007

(65) Prior Publication Data

US 2009/0081883 A1 Mar. 26, 2009

(51) Int. Cl.
*B05D 5/12* (2006.01)

(52) U.S. Cl. .......................... 427/58; 427/64; 427/66; 427/255.6; 117/88; 117/98

(58) Field of Classification Search .................. 427/58, 427/64, 66, 255.6; 117/88, 98
See application file for complete search history.

(56) References Cited

U.S. PATENT DOCUMENTS

| | | | |
|---|---|---|---|
| 4,413,022 A | 11/1983 | Suntola et al. | |
| 6,316,098 B1* | 11/2001 | Yitzchaik et al. | 428/339 |
| 6,808,803 B1 | 10/2004 | Yitzchaik | |
| 6,821,563 B2 | 11/2004 | Yudovsky | |
| 7,572,686 B2* | 8/2009 | Levy et al. | 438/149 |
| 2002/0106451 A1* | 8/2002 | Skarp et al. | 427/248.1 |
| 2003/0124457 A1* | 7/2003 | Jung et al. | 430/270.1 |
| 2003/0232511 A1* | 12/2003 | Metzner et al. | 438/785 |
| 2005/0084610 A1 | 4/2005 | Selitser | |
| 2005/0112874 A1* | 5/2005 | Skarp et al. | 438/680 |
| 2006/0017383 A1* | 1/2006 | Ishida et al. | 313/512 |
| 2006/0244107 A1 | 11/2006 | Sugihara et al. | |
| 2007/0077349 A1* | 4/2007 | Newman et al. | 427/66 |

(Continued)

FOREIGN PATENT DOCUMENTS

WO WO 2007/106788 A2 * 9/2007

OTHER PUBLICATIONS

Ritala, Mikko, et al., "Atomic Layer Deposition of Oxide Thin Films with Metal Alkoxides as Oxygen Sources". Science, vol. 288, Apr. 14, 2000, pp. 319-321.*

(Continued)

*Primary Examiner*—Bret Chen
(74) *Attorney, Agent, or Firm*—J. Larry Tucker; Chris P Konkol

(57) ABSTRACT

A process of making an organic thin film on a substrate by atomic layer deposition is disclosed, the process comprising simultaneously directing a series of gas flows along substantially parallel elongated channels, and wherein the series of gas flows comprises, in order, at least a first reactive gaseous material, an inert purge gas, and a second reactive gaseous material, optionally repeated a plurality of times, wherein the first reactive gaseous material is capable of reacting with a substrate surface treated with the second reactive gaseous material wherein the first reactive gaseous material, the second reactive gaseous material or both is a volatile organic compound. The process is carried out substantially at or above atmospheric pressure and at a temperature under 250° C., during deposition of the organic thin film.

19 Claims, 13 Drawing Sheets

U.S. PATENT DOCUMENTS

| | | | |
|---|---|---|---|
| 2007/0190247 A1 | 8/2007 | Jang et al. | |
| 2008/0100202 A1* | 5/2008 | Cok | 313/503 |
| 2008/0102313 A1* | 5/2008 | Nilsen et al. | 428/704 |
| 2008/0290787 A1* | 11/2008 | Cok | 313/503 |
| 2010/0092696 A1* | 4/2010 | Shinriki et al. | 427/576 |

OTHER PUBLICATIONS

Ghosh, A.P., et al., "Thin-film encapsulation of organic light-emitting devices". Applied Physics Letters, 86, 223503-1 to 223503-3 (2005).*

Lli, Zhengwen, et al., "Atomic Layer Deposition of Ultrathin Copper Metal Films from a Liquid Copper(I) Amidinate Precursor". Journal of The Electrochemical Society, 153 (11) C787-C794 (2006).*

Chongmu Lee, et al., "dependence of the electrical properties of the ZnO thin films grown by atomic layer epitaxy on the reactant feed sequence," J. Vac. Sci. Technol. A 24(4), Jul./Aug. 2006, pp. 1031-1035.

Matti Putkonen, et al., "Atomic Layer Deposition of Polyimide Thin Films," Journal of Materials Chemistry, 2007, 17, 664-669.

A. A. Dameron, "Molecular Layer Deposition of Alucone Polymer Films Using Trimethylaluminum and Various Gyols" (Abstract) to be presented Oct. 15, 2007 at the AVS 54th International Symposium, (Paper TF-MoA8).

Tetsuzo Yoshimura, et al., "Polymer Films Formed With Monolayer Growth Steps by Molecular Layer Depositon," Appl. Phys. Lett., vol. 59, No. 4, Jul. 1991, pp. 482-484.

* cited by examiner

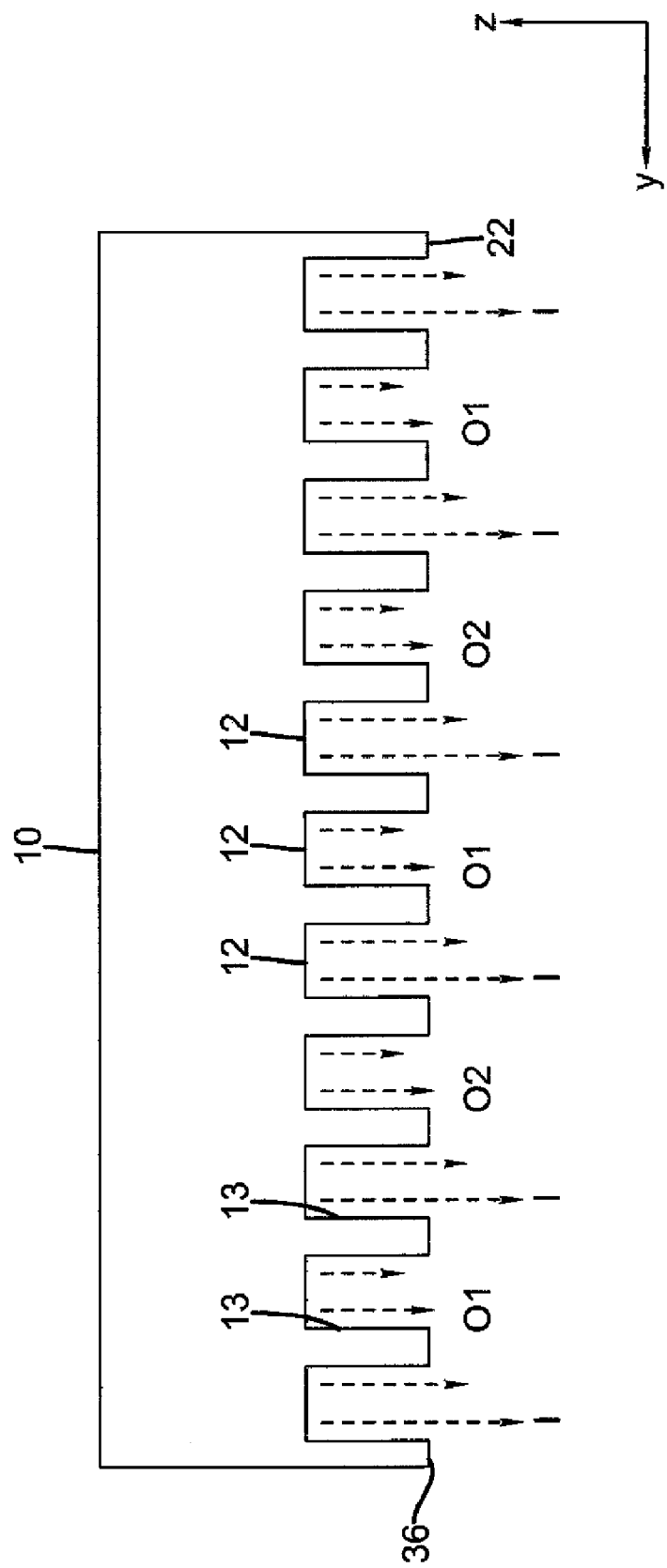

PROCESS FOR DEPOSITING ORGANIC MATERIALS

CROSS-REFERENCE TO RELATED APPLICATIONS

The present application is related to commonly assigned, co-pending US Application Publication Numbers 2007/0238311, 2007/0228470, 2008/0166880 (Levy), 2008/0166884 (Nelson et al.), 2009/0130858 (Levy), 2008/0182358 (Cowdery-Corvan et al.), 2009/0078204, 2009/0081366 (Kerr et al.), U.S. Pat. No. 7,572,686, (Levy et al.) and US. Application Publication Number 2009/0081885 (Levy et al.) All the above-identified applications are incorporated by reference in their entirety.

FIELD OF THE INVENTION

This invention generally relates to thin organic films and, more particularly, to a process using atomic or molecular layer deposition of the organic thin film onto a substrate. In particular, the present invention relates to a process of making a film of organic thin film, including an inorganic-organic hybrid thin film, which can be used in electronic or optical devices.

BACKGROUND OF THE INVENTION

Modern-day electronics require multiple patterned layers of electrically or optically active materials, typically over a relatively large substrate. Electronics such radio frequency identification (RFID) tags, photovoltaics, optical and chemical sensors all require some level of patterning in their electronic circuitry. Flat panel displays, such as liquid crystal displays or electroluminescent displays (ex. OLED), rely upon accurately patterned sequential layers to form thin film components of the backplane. These components include capacitors, transistors, and power buses. The industry is continually looking for new methods of materials deposition and layer patterning for both performance gains and cost reductions.

Organic films, including organic-inorganic hybrid films, can be very useful for a number of applications including insulating layers and protective layers. While many organic or hybrid organic films can be deposited from a solution casting method, there is interest in growing very high quality organic films by a molecular deposition process which promises to provide higher quality films or possibly the deposition of films that do not have easy solution processing routes.

Chemical vapor deposition (CVD) techniques, in which two reactive gasses are mixed to form the desired film material, can be useful routes to achieving high quality film growth. Atomic layer deposition ("ALD") is yet another alternative film deposition technology that can provide improved thickness resolution and conformal capabilities, compared to its CVD predecessor. The ALD process segments the conventional thin-film deposition process of conventional CVD into single atomic-layer deposition steps.

ALD can be used as a fabrication step for forming a number of types of thin-film electronic devices, including semiconductor devices and supporting electronic components such as resistors and capacitors, insulators, bus lines, and other conductive structures. General classes of functional materials that can be deposited with ALD include conductors, dielectrics or insulators, and semiconductors.

A number of device structures can be made with functional layers deposited by ALD. A capacitor results from placing a dielectric between two conductors. A diode results from placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor results from placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate-AH} + ML_x \rightarrow \text{substrate-AML}_{x-1} + HL \quad (1)$$

where HL is a reaction by-product. During the reaction, the initial surface ligands, AH, are consumed, and the surface becomes covered with $AML_{x-1}$ ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor and the HL by-product species from the chamber prior to the separate introduction of the other precursor.

A second molecular precursor then is used to restore the surface reactivity of the substrate towards the metal precursor. This is done, for example, by removing the L ligands and re-depositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \quad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:

1. $ML_x$ reaction;
2. $ML_x$ purge;
3. $AH_y$ reaction; and
4. $AH_y$ purge, and then back to stage 1.

ALD has been more typically utilized for the deposition of inorganic compounds where metal precursors have been halides, alkoxides, diketonate chelates, or organometallic compounds. The second precursor has been more typically an oxygen, nitrogen or sulfur source, when oxides, nitrides or sulfides are deposited, respectively. Although relatively less studied, there is utility in depositing organic compounds or organic/inorganic hybrid layers by ALD. In these cases, it is possible to still have an alternating sequence of self-limiting reactions, except that the limiting layer produced by such a process may be a layer of molecules as opposed to atoms. As such, such techniques may also be referred to as molecular layer deposition (MLD), although the basic concepts and deposition equipment are similar to ALD processes and equipment. An example of atomic layer or molecular layer deposition of organic films can be found in "ATOMIC LAYER DEPOSITION OF POLYIMIDE THIN FILMS," by Matti Putkonen, et al. in the Journal of Materials Chemistry, 2007, 17, 664-669, hereby incorporated by reference. As used herein the term "atomic layer deposition refers to both ALD and MLD, unless the context dictates otherwise.

The repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

Self-saturating surface reactions make ALD insensitive to transport non-uniformities, which might otherwise impair surface uniformity, due either to engineering tolerances and the limitations of the flow process or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide a uniform film thickness in a range of from about 3 nm to 300 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

An ALD process must be able to execute this sequencing efficiently and reliably for many cycles in order to allow cost-effective coating of many substrates. In an effort to minimize the time that an ALD reaction needs to reach self-termination, at any given reaction temperature, one approach has been to maximize the flux of chemicals flowing into the ALD reactor, using a so-called "pulsing" process. In the pulsed ALD process, a substrate sits in a chamber and is exposed to the above sequence of gases by allowing a first gas to enter the chamber, followed by a pumping cycle to remove that gas, followed by the introduction of a second gas to the chamber, followed by a pumping cycle to remove the second gas. This sequence can be repeated at any frequency and variations in gas type and/or concentration. The net effect is that the entire chamber experiences a variation in gas composition with time, and thus this type of ALD can be referred to as time dependent ALD. The vast majority of existing ALD processes are time dependent ALD.

In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized.

Existing ALD approaches have been compromised with the trade-off between the need to shorten reaction times and improve chemical utilization efficiency, and on the other hand, the need to minimize purge-gas residence and chemical removal times. One approach to overcome the inherent limitations of time depended ALD systems is to provide each reactant gas continuously and to move the substrate through each gas in succession. In these systems a relatively constant gas composition exists, but is located to specific areas or spaces of the processing system. Therefore, these systems will be referred to as spatially dependent ALD systems.

For example, U.S. Pat. No. 6,821,563 entitled "GAS DISTRIBUTION SYSTEM FOR CYCLICAL LAYER DEPOSITION" to Yudovsky a describes spatially dependent ALD processing system, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow spatially dependent ALD is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by a carrier gas opening between exhaust openings. Suntola et al. state that operation with such an embodiment is possible even at atmospheric pressure, although little or no details of the process, or examples, are provided.

While processes such as those described in the '563 Yudovsky and '022 Suntola et al. patents may avoid some of the difficulties inherent to pulsed gas approaches, these processes have other drawbacks. For example, it would be very difficult to maintain a uniform vacuum at different points in an array and to maintain synchronous gas flow and vacuum at complementary pressures, thus compromising the uniformity of gas flux that is provided to the substrate surface. Neither the gas flow delivery unit of the '563 Yudovsky patent nor the gas flow array of the '022 Suntola et al. patent can be used in closer proximity to the substrate than about 0.5 mm.

U.S. Patent Publication No. 2005/0084610 to Selitser discloses an atmospheric pressure atomic layer chemical vapor deposition process. Selitser state that extraordinary increases in reaction rates are obtained by changing the operating pressure to atmospheric pressure, which will involve orders of magnitude increase in the concentration of reactants, with consequent enhancement of surface reactant rates. The embodiments of Selitser involve separate chambers for each stage of the process, although FIG. 10 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes thereunder in the process. Little or no specific details of the gas injectors or manifolds are described by Selitser, although it is stated that spacing of the injectors is selected so that cross-contamination from adjacent injectors is prevented by purging gas flows and exhaust manifolds incorporate in each injector.

The molecular layer deposition of alucone polymer films on silicon substrates using trimethylaluminum and various glycols has been disclosed in an abstract by A. A. Dameron for a paper submitted to the AVS 54th International Symposium, paper TF-MoA8, to be presented Oct. 15, 2007. Atomic layer deposition of thin films of Alq$_3$, Znq$_3$ and Tiq$_3$, where q is 8-hydroxyquinoline, is also known, as disclosed in US Patent Publication No. 2007/0190247 to Jang et al., hereby incorporated by reference. Polymer films formed with monolayer growth steps by molecular layer deposition is disclosed in *Appl. Phys. Lett.*, Vol. 59, No. 4, July 1991. A method of forming a thin film of molecules of selected polycyclic aromatic compounds such as a polycyclic tetracarboxylic-dianhydride compound capable of forming axial-end diamide linkages and the like is disclosed in U.S. Pat. No. 6,808,803 to Yitzchaik.

There remains still a need to provide materials and processes for the deposition of organic materials by atomic layer deposition that can overcome the problems and disadvantages in the prior art.

SUMMARY OF THE INVENTION

The present invention provides a process for the deposition of organic material that is compatible with spatially dependent ALD. In particular, the present invention relates to a process of making an organic thin film on a substrate by atomic layer deposition, comprising simultaneously directing a series of gas flows along substantially parallel elongated channels, and wherein the series of gas flows comprises, in order, at least a first reactive gaseous material, an inert purge gas, and a second reactive gaseous material, optionally repeated a plurality of times, wherein the first reactive gaseous material is capable of reacting with a substrate surface treated with the second reactive gaseous material and the second reactive gaseous material is capable of reacting with a surface treated with the first reactive gaseous material to form the thin film, wherein the first reactive gaseous material, the second reactive gaseous material or both is a volatile organic compound, wherein the process is carried out substantially at or above atmospheric pressure, wherein the temperature of the substrate during deposition is under 250° C., and wherein the deposited organic thin film comprises at least 20 atomic weight percent carbon.

During the process, the substrate or deposition device for the gaseous materials, or both, is capable of providing relative movement between the output face of the deposition device and the substrate while maintaining close proximity.

In a preferred embodiment, the process can be operated with continuous movement of a substrate being subjected to thin film deposition, wherein the process is capable of conveying the support on or as a web past the deposition device, preferably in an unsealed environment to ambient at substantially atmospheric pressure.

It is yet a further advantage of the present invention that it is adaptable for deposition on a web or other moving substrate, including deposition onto a large area substrate.

It is a further advantage of the present invention that it allows operation, in preferred embodiments, under atmospheric pressure conditions.

It is still a further advantage of the present invention that it can be employed in low temperature processes at atmospheric pressures, which processes may be practiced in an unsealed environment, open to ambient atmosphere.

The invention is also directed to a transistor comprising an organic or inorganic-organic hybrid material, preferably on a flexible substrate, made by the present process.

The objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 4 is a cross-sectional side view of an embodiment, for one exemplary system of gaseous materials, of the distribution of gaseous materials to a substrate that is subject to thin film deposition;

DETAILED DESCRIPTION OF THE INVENTION

Figure 1:
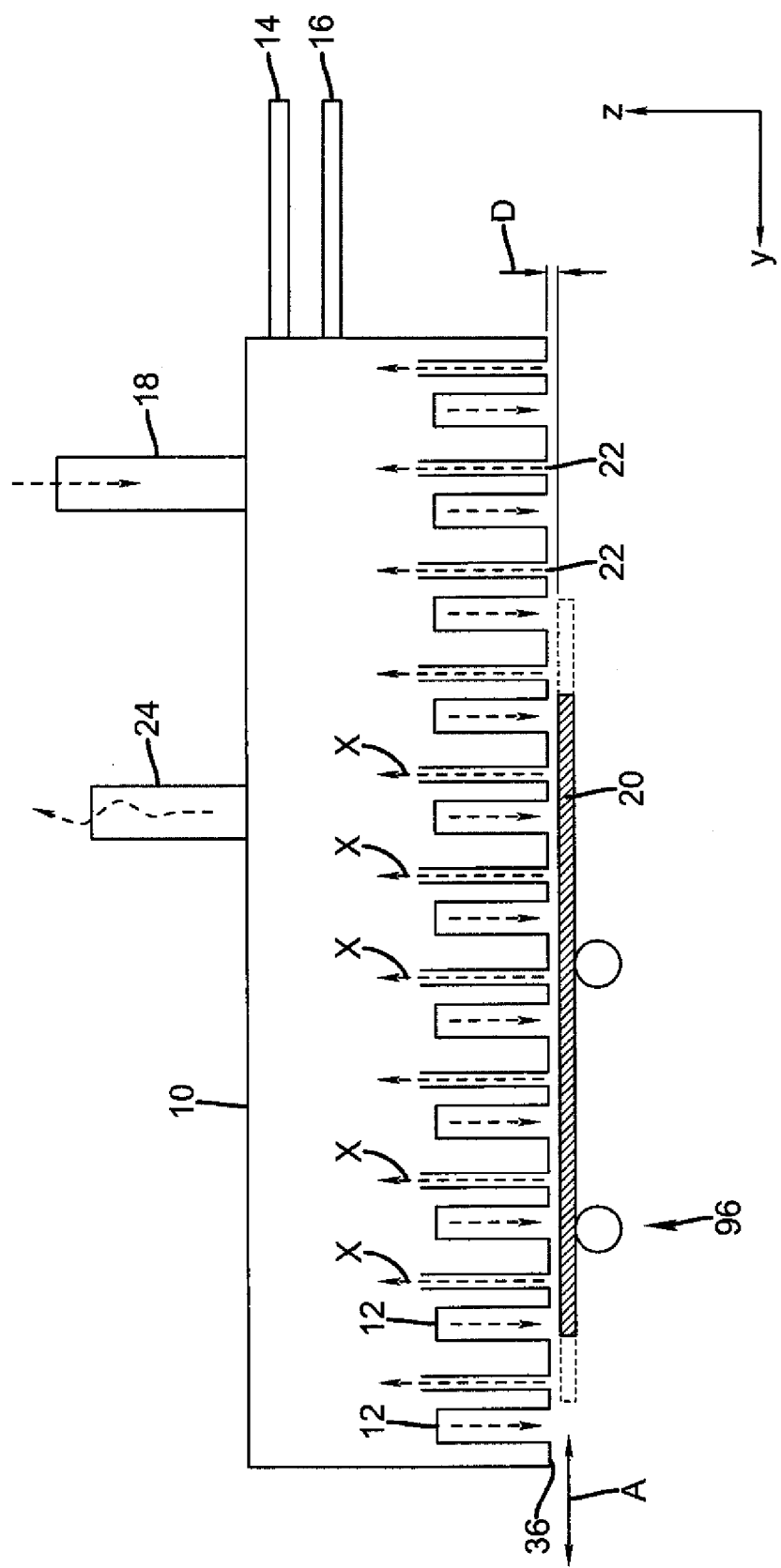
FIG. 1 is a cross-sectional side view of a delivery head for atomic layer deposition for one embodiment of the present invention.

The present invention, as indicated above, is directed to a process of making an organic thin film on a substrate by atomic layer deposition, comprising simultaneously directing a series of gas flows along substantially parallel elongated channels and out elongated output openings to form the organic thin film, wherein the first reactive gaseous material, the second reactive gaseous material or both is a volatile organic compound. The deposited organic thin film comprises at least 20 atomic weight percent carbon. The organic thin film can be an inorganic-organic hybrid thin film.

In the present process, the series of gas flows comprises, at least a first reactive gaseous material, an inert purge gas, and a second reactive gaseous material, optionally repeated a plurality of times, wherein the first reactive gaseous material is capable of reacting with a substrate surface treated with the second reactive gaseous material and the second reactive gaseous material is capable of reacting with a surface treated with the first reactive gaseous material to form the thin film.

In one embodiment, the first reactive gaseous material, the second reactive gaseous material or both is a volatile organic compound, and the first reactive gaseous material comprises a metal or metalloid atom, for example, a metal or metalloid atom bonded to carbon, nitrogen, oxygen or hydrogen. The metal or metalloid atom, for example, can be aluminum, zinc, titanium, or silicon. The metal or metalloid atom can be in association with a beta-diketonate compound.

In one embodiment, the second reactive gaseous material comprises one or more hydroxyl groups, thiol groups, or amine groups. For example, the second reactive compound can be a diol, dithiol, diamine, or quinolinates.

The entire process of making the organic containing thin film of the present invention can be carried out below a maximum support temperature of about 300° C., more preferably below 250° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive circuits containing thin film transistors with significantly improved performance.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The process of the present invention offers a significant departure from conventional approaches to making organic containing thin films, employing a system for delivery of gaseous materials to a substrate surface that can be adaptable to deposition on larger and web-based substrates and capable of achieving a highly uniform thin-film deposition at improved throughput speeds. The process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment.

Referring to FIG. 1, a cross-sectional side view of one embodiment of a delivery head 10 for atomic layer deposition onto a substrate 20 according to the present invention is shown. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at an output face 36 via output channels 12, having a structural arrangement that may include a diffuser, as described subsequently. The dashed line arrows in FIG. 1 refer to the delivery of gases to substrate 20 from delivery head 10. In FIG. 1, dotted line arrows X also indicate paths for gas exhaust (shown directed upwards in this figure) and exhaust channels 22, in communication with an exhaust conduit 24 that provides an exhaust port. Since the exhaust gases may still contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate. It should be noted that reciprocating motion is not always required for thin-film deposition using delivery head 10. Other types of relative motion between substrate 20 and delivery head 10 could also be provided, such as movement of either substrate 20 or delivery head 10 in one or more directions.

Figure 2:
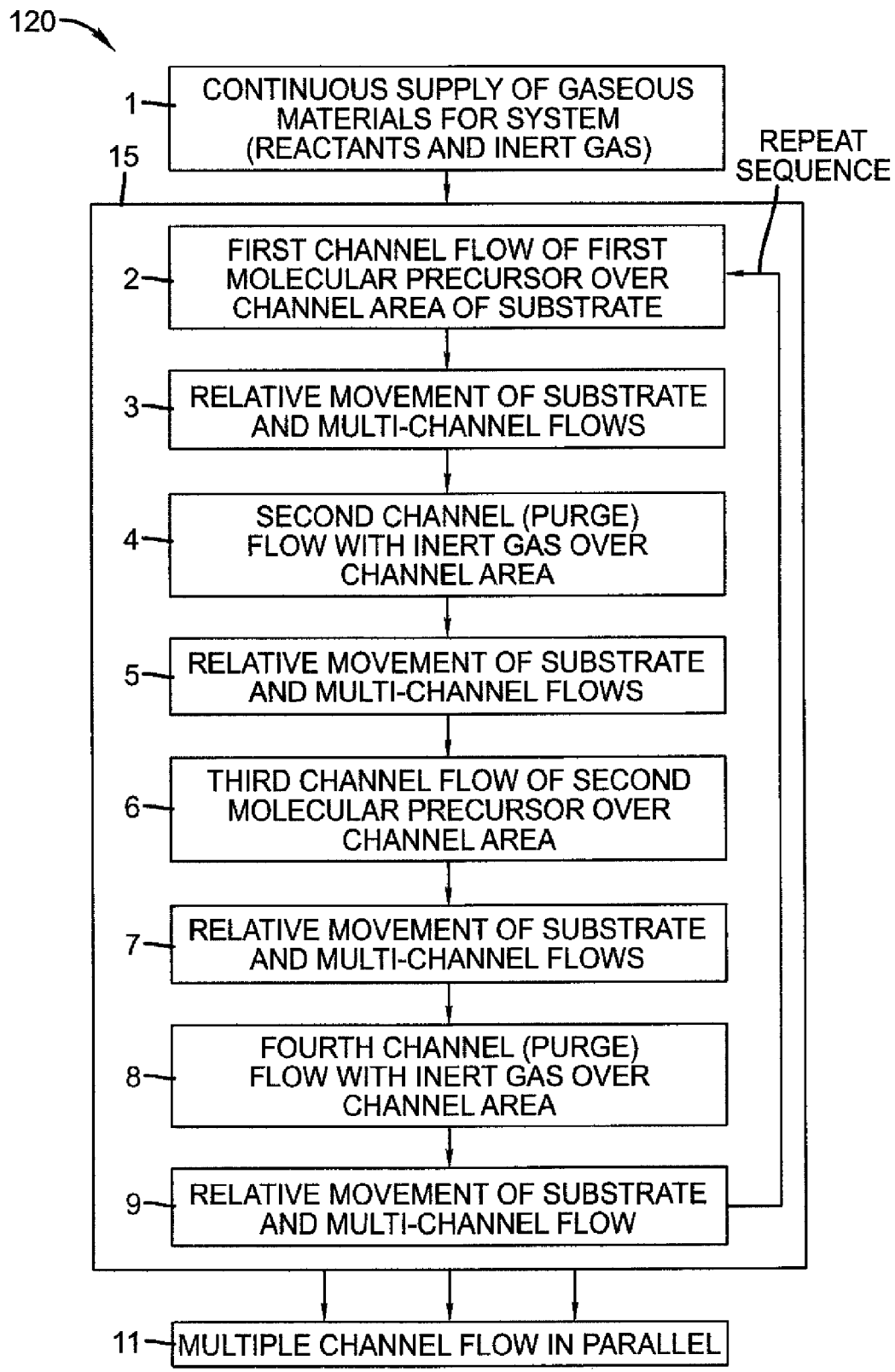
FIG. 2 is a flow chart describing the steps for an ALD process for use in the present invention.

FIG. 2 is a generalized step diagram of a preferred embodiment of an ALD process 120 for making the thin film, in which two reactive gases are used, a first molecular precursor and a second molecular precursor. Gases are supplied from a gas source and can be delivered to the substrate, for example, via a deposition device. Metering and valving apparatus for providing gaseous materials to the deposition device can be used.

As shown in Step 1, a continuous supply of gaseous materials for the system is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now (in this particular embodiment, transversely and substantially parallel to the surface of the substrate) over the given channel area of the substrate and reacts with the previous layer on the substrate to produce (theoretically) a monolayer of a desired material. A first molecular precursor is in gas form, for example, an organic compound or an organometallic compound such as diethylzinc or trimethyl-aluminum. In such an embodiment, the second molecular precursor is also in gaseous form and can be, for example, an organic compound which with react with the organometallic compound to form a hybrid inorganic-organic or alternatively a different organometallic compound.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film. In the present embodiment of the process, the steps are repeated with respect to a 30 given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed, which results in multiple channel flows in parallel, as indicated in overall Step 11. Parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with first material at the surface, forming a compound with the freshly deposited first precursor.

This particular embodiment does not need to use a vacuum purge to remove a molecular precursor after applying it to the substrate. Purge steps are expected by most researchers to be the most significant throughput-limiting step in ALD processes.

Figure 3:
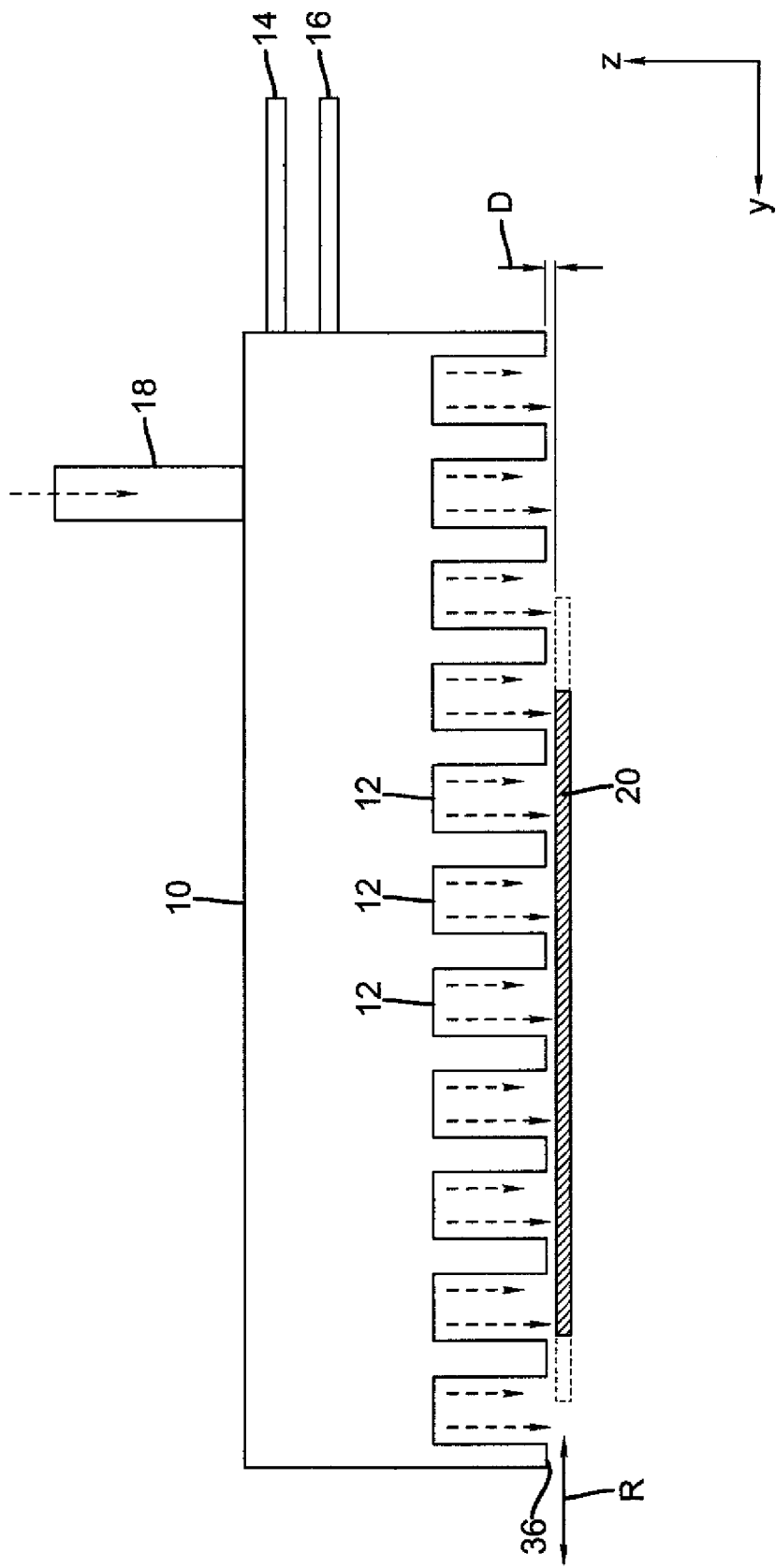
FIG. 3 is a cross-sectional side view of one embodiment of a deposition device for atomic layer deposition that can be used in the present process.

Assuming that, for the two reactant gases in FIG. 3, AX and BY are used, for example. When the reaction gas AX flow is supplied and flowed over a given substrate area, atoms of the reaction gas AX are chemically adsorbed on a substrate, resulting in a layer of A and a surface of ligand X (associative chemisorptions) (Step 2). Then, the remaining reaction gas AX is purged with an inert gas (Step 4). Then, the flow of reaction gas BY, and a chemical reaction between AX (surface) and BY (gas) occurs, resulting in a molecular layer of AB on the substrate (dissociative chemisorptions) (Step 6). The remaining gas BY and by-products of the reaction are purged (Step 8). The thickness of the thin film may be increased by repeating the process cycle (steps 2-9) many times.

Because the film can be deposited one monolayer at a time it tends to be conformal and have uniform thickness.

Materials that can be made using the process of the present invention include, but are not limited to: alucone, borocone, Bakelite, and polyurethane.

It will be apparent to the skilled artisan that alloys of two, three, or more materials may be deposited, compounds may be deposited with two, three, or more constituents, and such things as graded films and nano-laminates may be produced as well.

These variations are simply variants using particular embodiments of the invention in alternating cycles. There are many other variations within the spirit and scope of the invention, so the invention is limited only by the claims that follow.

For various volatile zinc-containing precursors, precursor combinations, and reactants useful in ALD thin film processes, reference is made to the Handbook of *Thin Film Process Technology*, Vol. 1, edited by Glocker and Shah, institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

Referring now to FIG. 3, there is shown a cross-sectional side view of one embodiment of a delivery head device 10 that can be used in the present process for atomic layer deposition onto a substrate 20 according to the present invention. Delivery head 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 3 and subsequent FIGS. 5A and 5B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Delivery head 10 is spaced a distance D from substrate 20, provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 3, substrate 20 is moved across output face 36 in reciprocating fashion, as indicated by the arrow R and by phantom outlines to the right and left of substrate 20 in FIG. 1. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

The cross-sectional view of FIG. 4 shows gas flows emitted over a portion of output face 36 of delivery head 10. In this particular arrangement, each output channel 12, separated by partitions 13, is in gaseous flow communication with one of gas inlet ports 14, 16 or 18 seen in FIG. 3. Each output channel 12 delivers typically a first organic oxidative reactant gaseous material O1, or a second organo-metallic or organic reactant gaseous material O2, or a third inert gaseous material I.

FIG. 4 shows a relatively basic or simple arrangement of gases. It is envisioned that a plurality of second deposition precursors (like material O1) or a plurality of first precursor materials (like material O2) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of materials or having lesser amounts of dopants admixed in a material. The inter-stream labeled I separates any reactant channels in which the gases are likely to react with each other.

First and second reactant gaseous materials O1 and O2 react with each other to effect ALD deposition, but neither reactant gaseous material O1 nor O2 reacts with inert gaseous material I. Inert gaseous material I could be nitrogen, argon, helium, or other gases commonly used as purge gases in ALD processes. Inert gaseous material I is inert with respect to first or second reactant gaseous materials O1 and O2. Reaction between first and second reactant gaseous materials would form a organometallic compound or other binary compound, such as alucone, in one embodiment. Reactions between more than two reactant gaseous materials could form other materials such as a ternary compound.

Figure 5A:
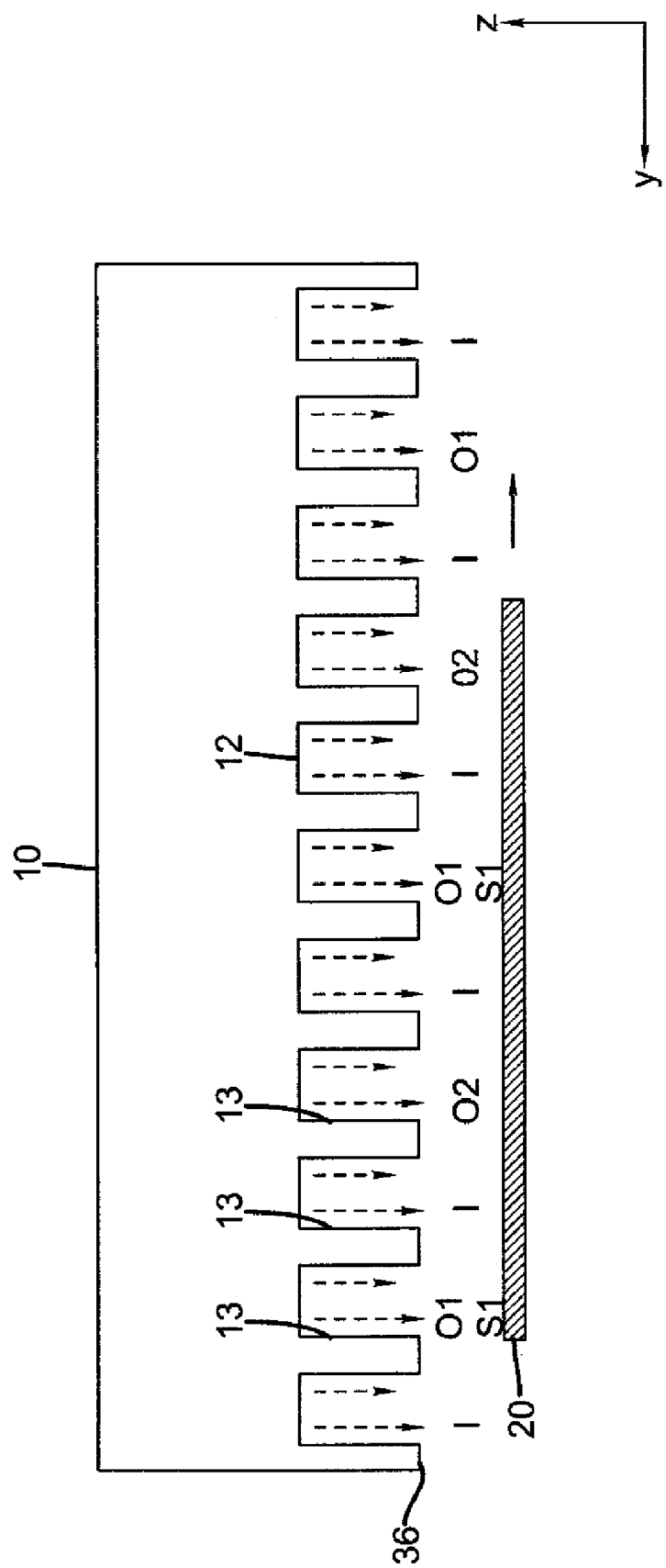
FIGS. 5A and 5B are cross-sectional side views of one embodiment of the distribution of a system of gaseous materials, schematically showing the accompanying deposition operation.
Figure 5B:
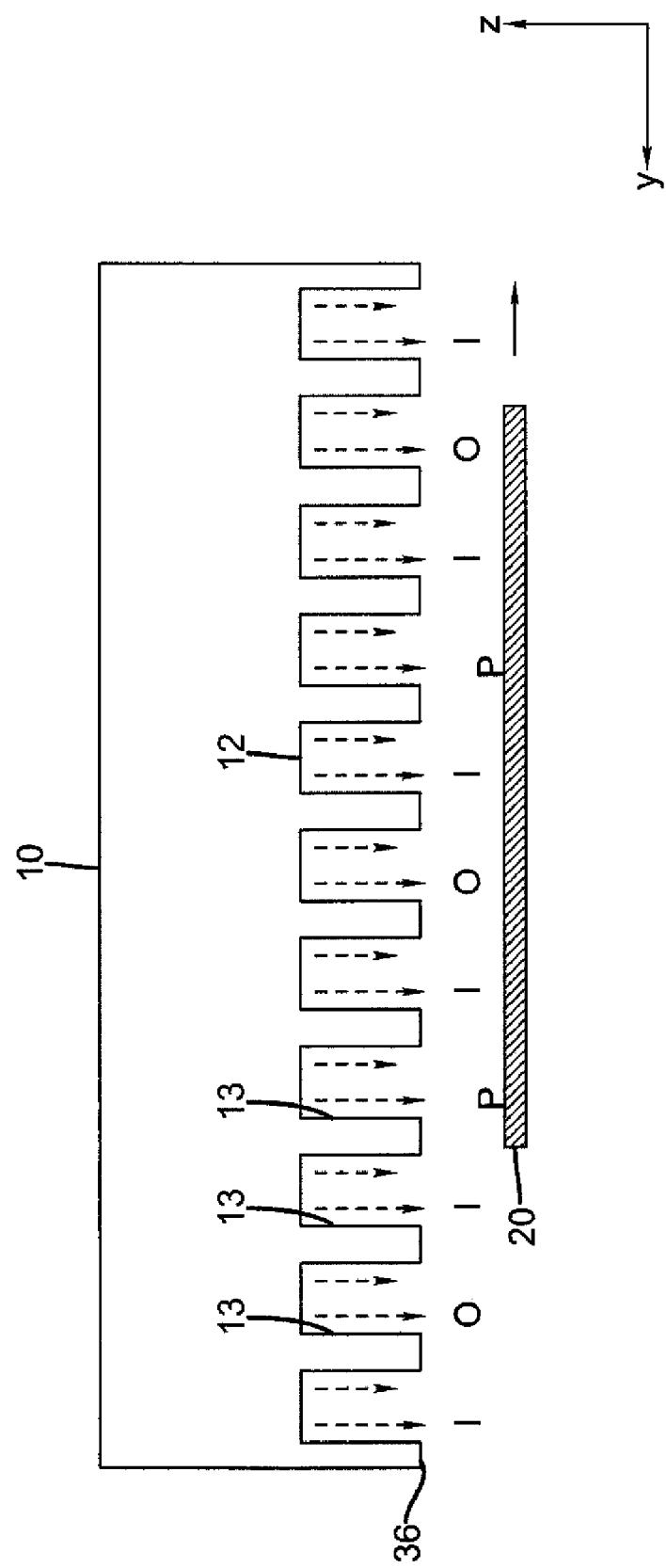

The cross-sectional views of FIGS. 5A and 5B show, in simplified schematic form, the ALD coating operation performed as substrate 20 passes along output face 36 of delivery head 10 when delivering reactant gaseous materials O1 and O2. In FIG. 5A, the surface of substrate 20 first receives an exposure to O1 from output channels 12 designated as delivering first reactant gaseous material O1. The surface of the substrate now contains a partially reacted form of material O1, which now indicated as surface species S1 and is susceptible to reaction with material O2. Then, as substrate 20 passes into the path of the reactive compound of second reactant gaseous material O2, the reaction with O2 takes place, forming a thin film of product material P that can be formed from two reactant gaseous materials.

As FIGS. 5A and 5B show, inert gaseous material I is provided in every alternate output channel 12, between the flows of first and second reactant gaseous materials O1 and O2. Sequential output channels 12 are adjacent, that is, share a common boundary, formed by partitions 22 in the embodiments shown. Here, output channels 12 are defined and separated from each other by partitions 22 that extend at a perpendicular to the surface of substrate 20.

Figure 6:
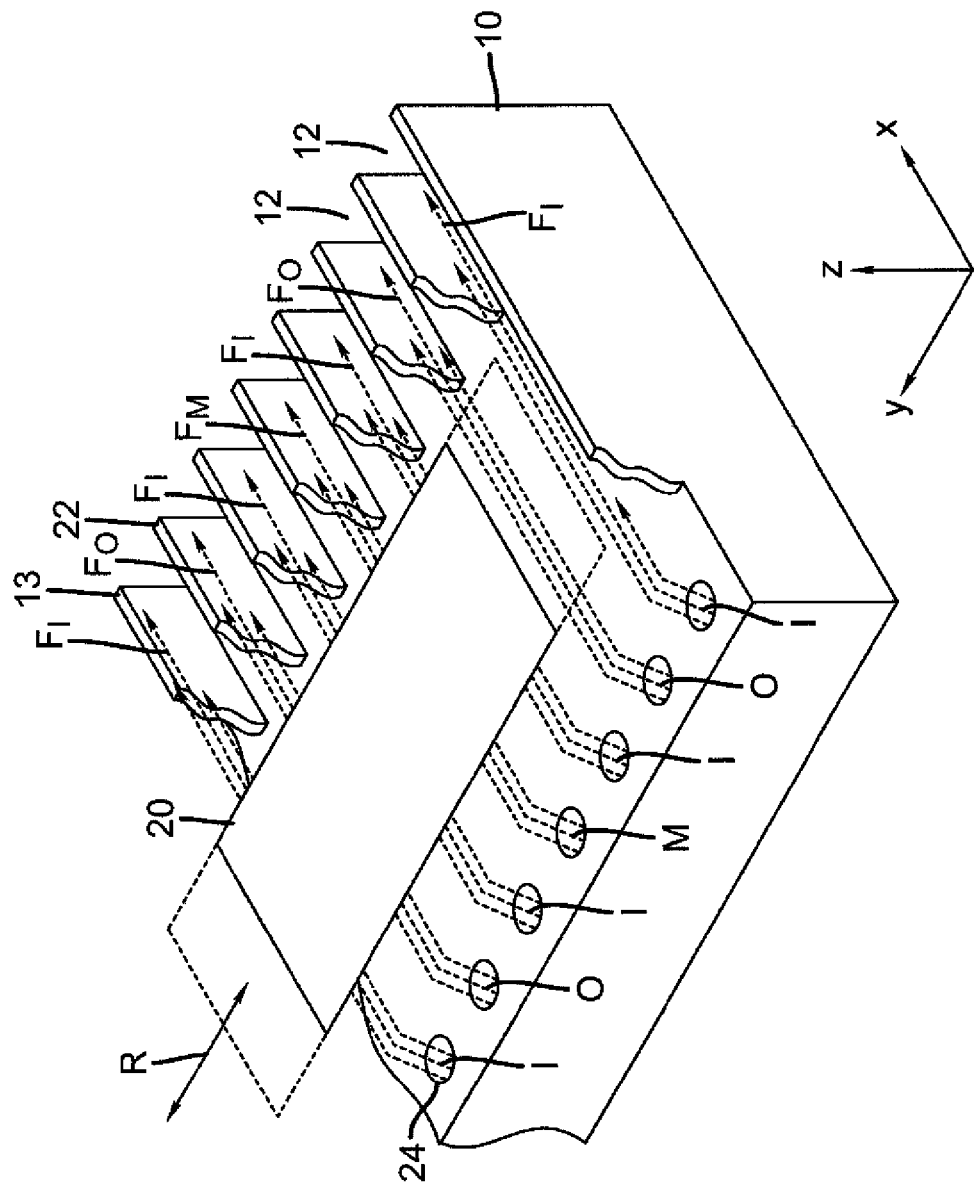
FIG. 6 is a perspective view, from the output face side, of a portion of one embodiment of a deposition device, showing the orientation of output channels relative to the substrate and reciprocating motion showing one exemplary arrangement of gas flow in the deposition device.

FIG. 6 shows a perspective view of one embodiment of delivery head 10 that can be used in the present process, from the output face 36 (that is, from the underside with respect to FIGS. 3-5B). Partitions 13 that define and separate the adjacent output channels 12 in this embodiment are represented as partially cut away, to allow better visibility for the gas flows flowing from gas outlet ports 24. FIG. 6 also shows reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 6 shows the gas flows $F_I$, $F_O$, and $F_M$ for the various gaseous materials delivered from delivery head 10 with this embodiment. Gas flows $F_I$, $F_O$, and $F_M$ are in the x-direction, that is, along the length of elongated output channels 12.

Figure 7A:
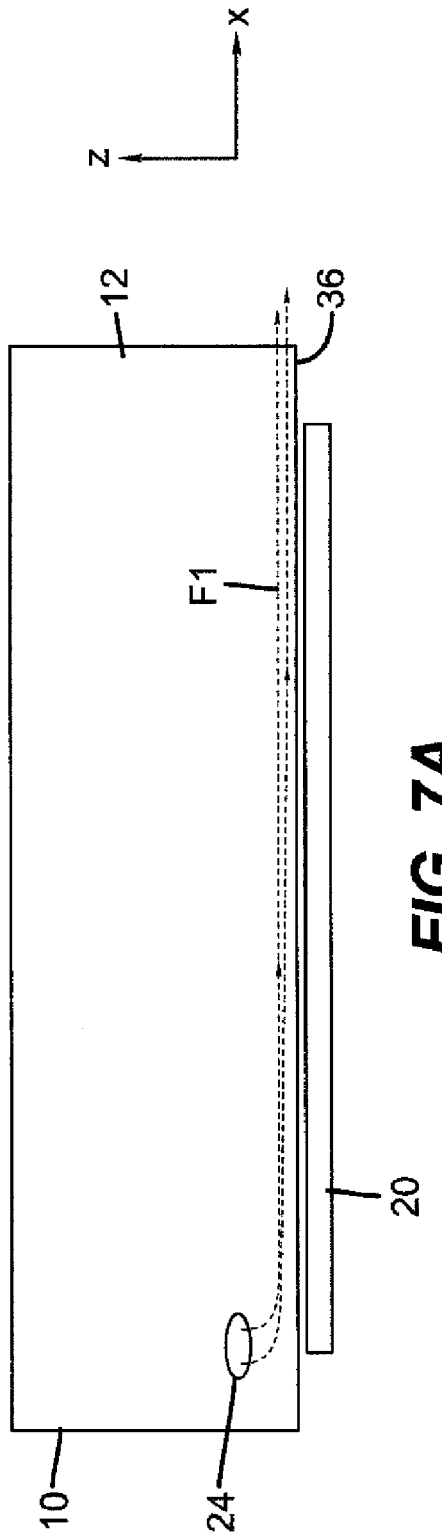
FIGS. 7A and 7B are cross-sectional views taken orthogonally to the cross-sectional views of previous FIGS. 4-5B, showing gas flow directions for output channels in various embodiments.
Figure 7B:
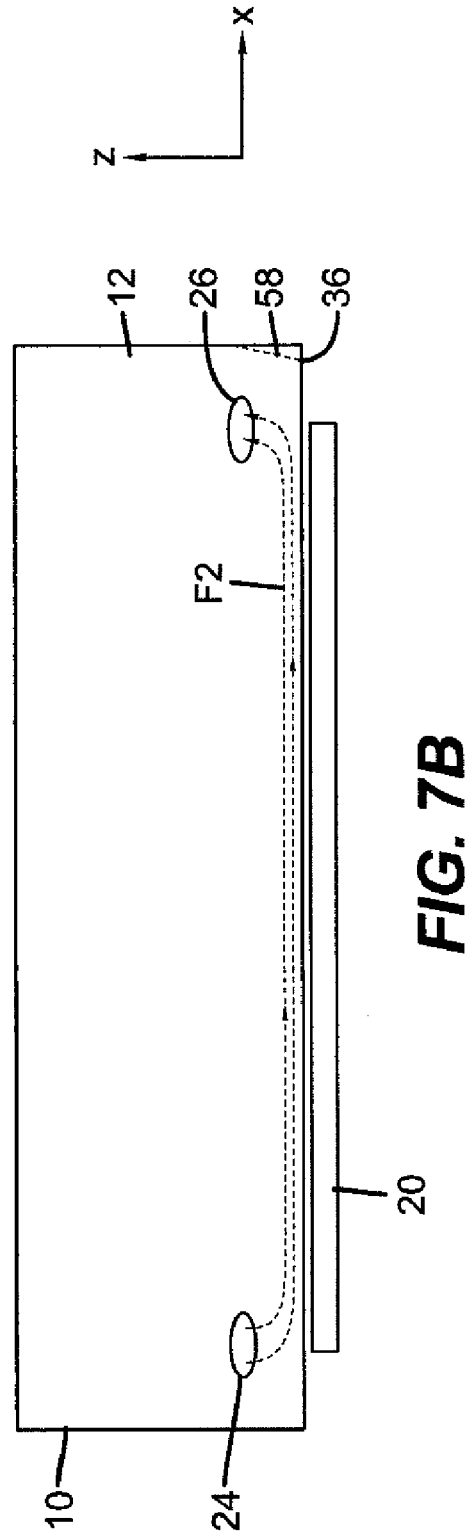

The cross-sectional views of FIGS. 7A and 7B are taken orthogonally to the cross-sections of FIGS. 3-5B and show gas flows in one direction from this view. Within each output channel 12, the corresponding gaseous material flows from a gas output port 24, shown in phantom in the views of FIGS. 7A and 7B. In the embodiment of FIG. 7A, gas flow F1 directs the gaseous material along the length of output channel 12 and across substrate 20, as was described with reference to FIG. 6. Flow F1 continues past the edge of delivery head 10 in this arrangement, flowing outward into the environment or, if desirable, to a gas collection manifold (not shown). FIG. 8B shows an alternative embodiment for gas flow F2 in which output channel 12 also provides an exhaust port 26 for redirection or drawing off of the gas flow. Although unidirectional flows are preferred, some degree of mixing can occur and even may be beneficial to some extent, depending on the flow rates and other circumstances involved in a particular application.

A particular delivery head 10 may use output channels 12 configured using any one of the gas flow configurations or combinations thereof, either the F1 flow of FIG. 7A the F2 flow of FIG. 7B, or some other variation in which gaseous material is directed to flow across substrate 20 along output channel 12, preferably in a substantially laminar or smooth fashion with controlled mixing. In one embodiment, one or more exhaust ports 26 are provided for each output channel 12 that delivers a reactant gaseous material. For example, referring to FIG. 7, output channels 12 for first and second reactant gaseous materials, labeled O and M, are configured with exhaust ports 26 to vent or draw off the reactant substances, following the pattern of flow F2 (FIG. 8B). This allows some recycling of materials and prevents undesirable mixing and reaction near the end of the manifold. Output channels 12 for inert gaseous material, labeled I, do not use exhaust ports 26 and thus follow the pattern of flow F1 (FIG. 7A). Although laminar flows are preferred in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere, whereas a typical vacuum is, for example, below 0.1 atmosphere. An optional baffle 58, as shown in dotted outline in FIG. 8B, may be provided to redirect the flow pattern into exhaust port 26.

Because no gas flow around partition 13 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 to Yudovsky, cited earlier, required gas flow around the edges of channel sidewalls and was thus limited to 0.5 mm or greater distance to the substrate surface. Positioning the delivery head 10 closer to the substrate surface is preferred in the present invention. In a preferred embodiment, distance D from the surface of the substrate can be 0.4 mm or less, preferably within 0.3 mm, more preferably within 0.25 mm of the output face of the deposition device or the bottom of the guide walls that provide the flow channels.

In order to provide smooth flow along the length of output channel 12, gas output port 24 may be inclined at an angle away from normal, as indicated in FIGS. 7A and 7B. Optionally, some type of gas flow redirecting structure may also be employed to redirect a downward flow from gas output port 24 so that it forms a gas flow that runs substantially in parallel to output face 36.

As was particularly described with reference to FIGS. 5A and 5B, delivery head 10 requires movement relative to the surface of substrate 20 in order to perform its deposition function. This relative movement can be obtained in a number of ways, including movement of either or both delivery head 10 and substrate 20, such as by movement of a process that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O1 and one application of second reactant gaseous material O2.

The distance between output channels for O1 and O2 reactant gaseous materials determines the needed distance for reciprocating movement to complete each cycle. For an example, delivery head 10, having a nominal channel width of 0.034 inches in width W for each output channel 12, reciprocating motion (along the y axis as used herein) of at least 0.20 inches would be required. For this example, an area of substrate 20 would be exposed to both first reactant gaseous material O1 and second reactant gaseous material O2 with movement over this distance. In some cases, consideration for uniformity may require a measure of randomness to the amount of reciprocating motion in each cycle, such as to reduce edge effects or build-up along the extremes of reciprocation travel.

A delivery head 10 may have only enough output channels 12 to provide a single cycle. Alternately, delivery head 10 may have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, preferably less than 100 milliseconds. The relative movement of the substrate to a channel during oscillation is at a speed at least 0.1 cm/sec, and the gas flow in the channels is at least 1 cm/sec. Preferably, the temperature of the substrate during deposition is under 300° C., more preferably under 250° C.

Figure 8:
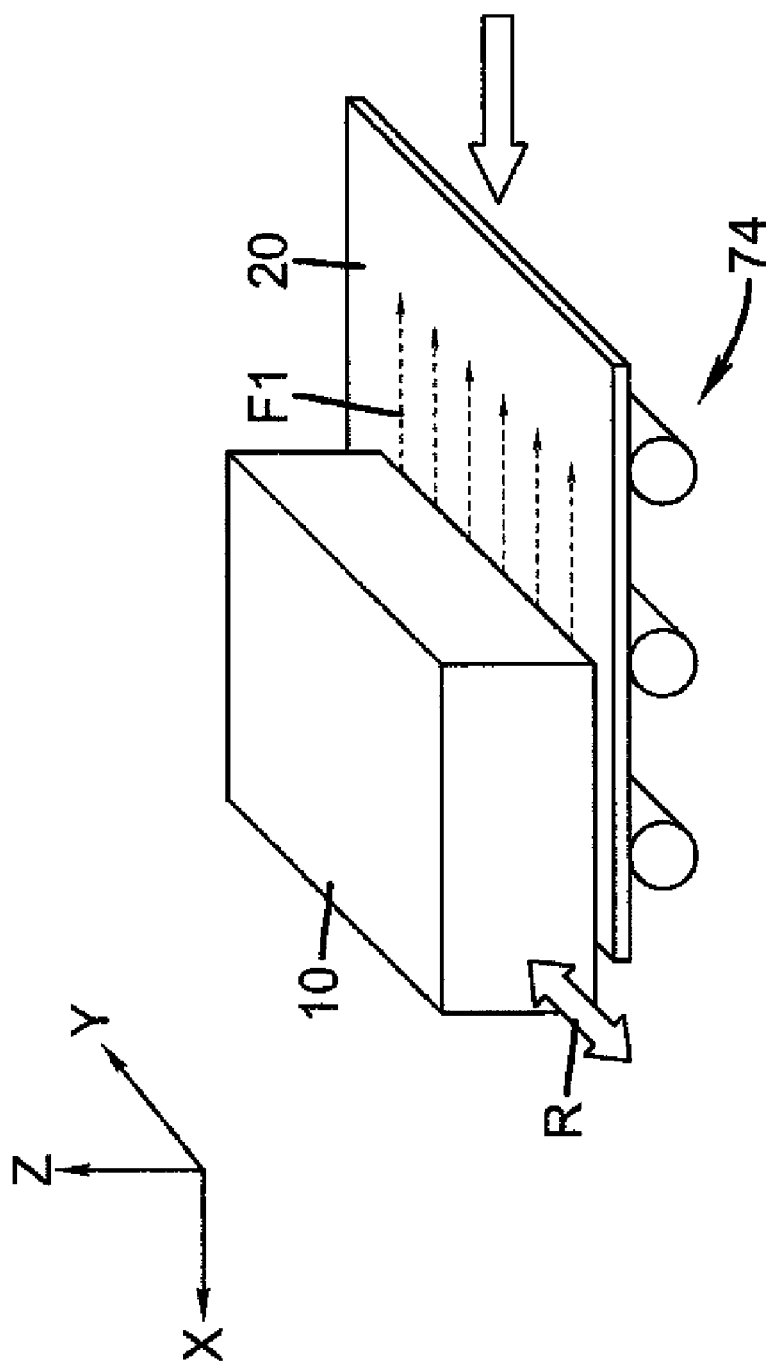
FIG. 8 is a schematic diagram showing an alternative motion pattern for reciprocating and orthogonal movement.

An advantage of the reciprocating motion used for a delivery head 10 used in one embodiment of the present process is that it allows deposition onto a substrate 20 whose area exceeds the area of output face 36. FIG. 8 schematically shows how this broader area coverage can be effected, using reciprocating motion along the y axis as shown by arrow R and also movement orthogonal or transverse to the reciprocating motion, relative to the x axis. Again, it must be emphasized that motion in either the x or y direction, as shown in FIG. 9, can be effected either by movement of delivery head 10, or by movement of substrate 20 provided with a substrate support 74 that provides movement, or by movement of both delivery head 10 and substrate 20.

In FIG. 8 the relative motion of the deposition head and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the deposition device over a fixed substrate 20; an oscillation combined with displacement of the substrate 20 relative to a fixed substrate 20 deposition device; or any combinations wherein the oscillation and fixed motion are provided by movements of both the substrate and the delivery head 10.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the process of the present invention.

Figure 9:
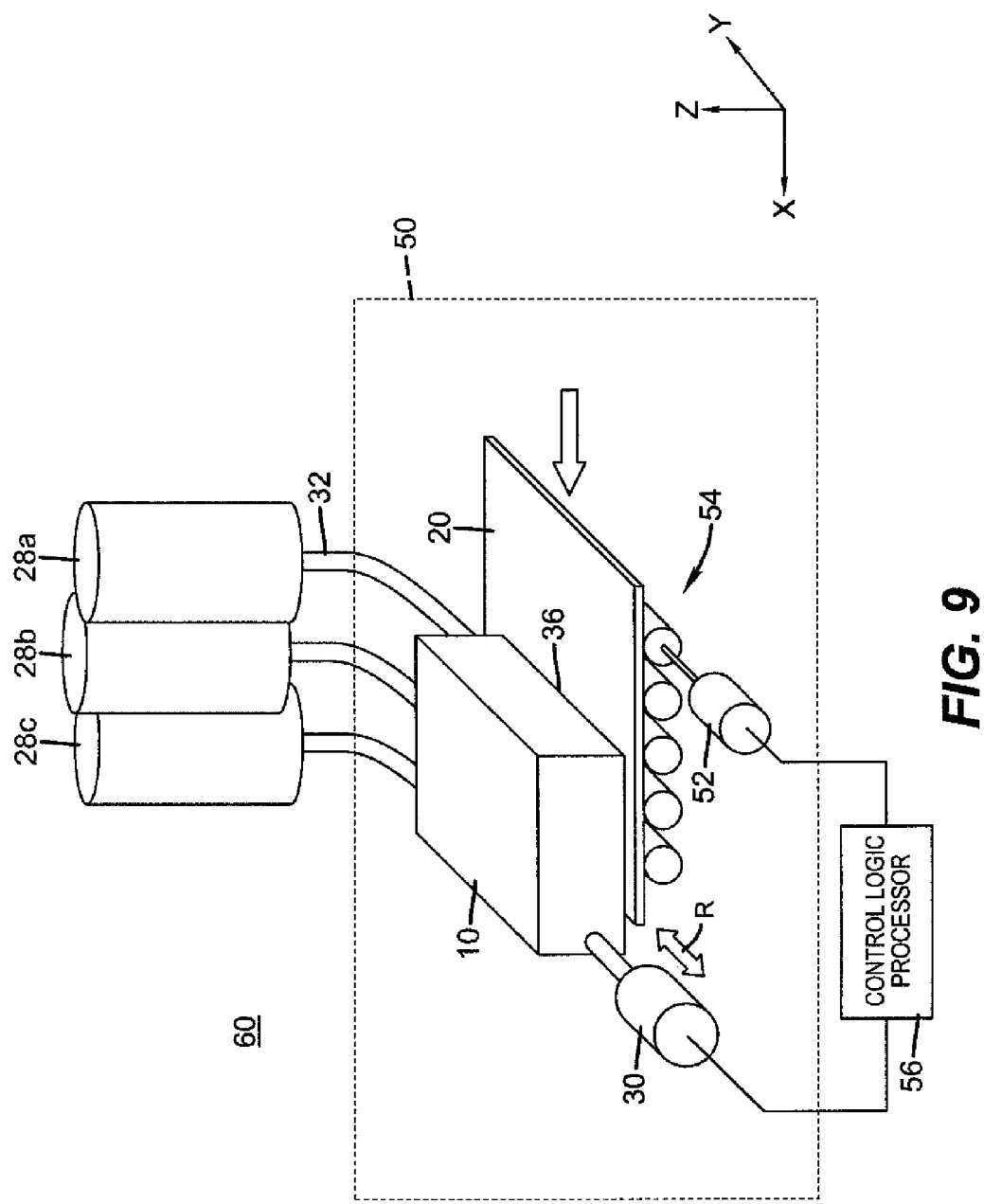
FIG. 9 is a block diagram of one embodiment of a deposition system that uses the process according to the present invention.
Figure 10:
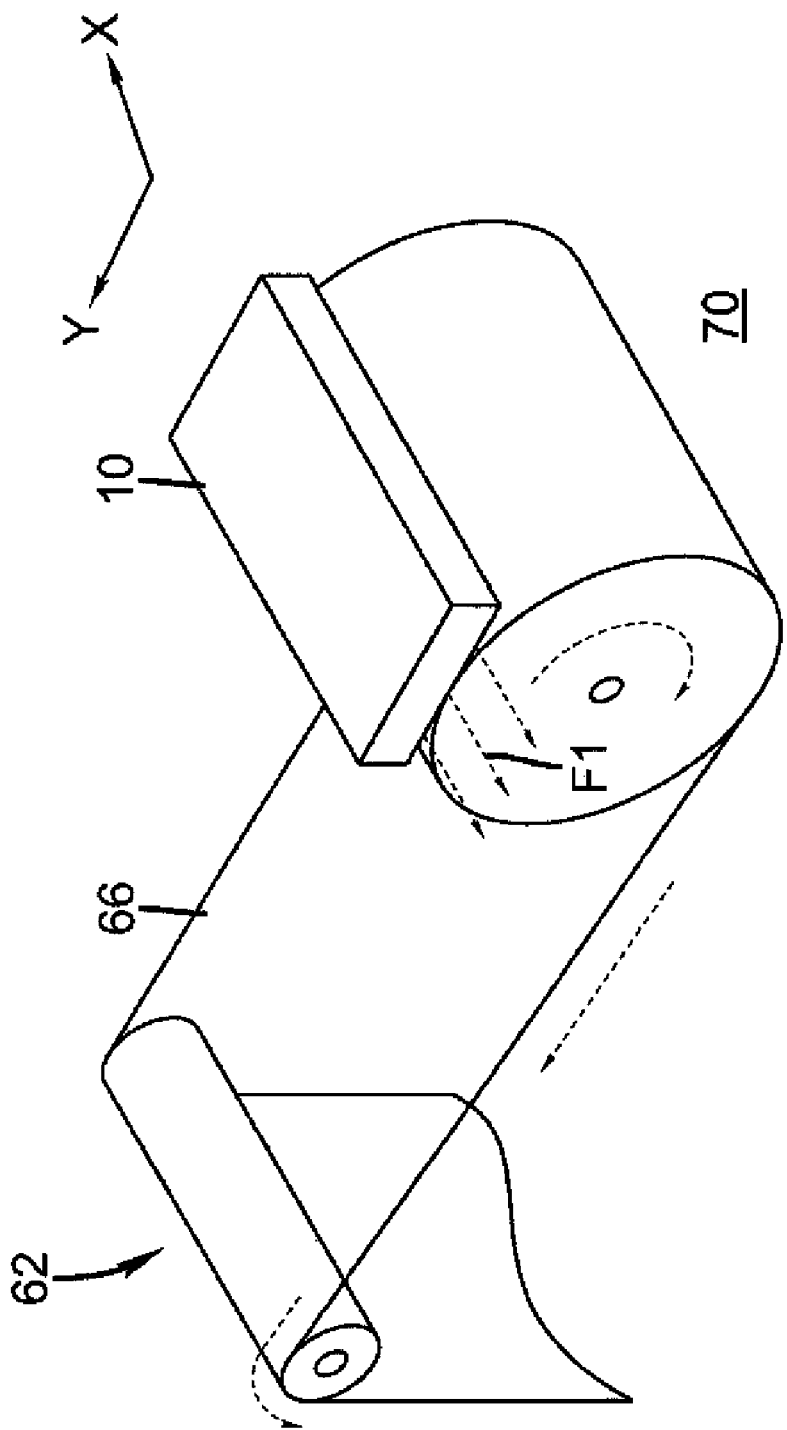
FIG. 10 is a block diagram showing another embodiment of deposition system applied to a moving web in accordance with the present process, with the deposition device stationary.

FIG. 9 shows an Atomic Layer Deposition (ALD) 60 system, for making an organic thin film, having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, an optional vacuum vapor recovery process and other support components are not shown in FIG. 10 but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 10, control logic processor 56 controls an actuator 30 for providing reciprocating motion to delivery head 10 and also controls a transport motor 52 of transport subsystem 54.

FIG. 10 shows an Atomic Layer Deposition (ALD) system 70 for depositing a thin film in a web arrangement, using a stationary delivery head 10 in which the flow patterns are oriented orthogonally to the configuration of FIG. 10. In this arrangement, motion of web conveyor 62 itself provides the movement needed for ALD deposition. Reciprocating motion could also be used in this environment, such as by repeatedly reversing the direction of rotation of a web roller to move web substrate 66 forward and backwards relative to delivery head 10. Reciprocation motion can also be obtained by allowing a reciprocating motion of the delivery head 10 across an arc whose axis coincides with the roller axis, while the web substrate 66 is moved in a constant motion. In another embodiment at least a portion of delivery head 10 has an output face 36 having an amount of curvature (not shown), which might be advantageous for some web coating applications. Convex or concave curvature could be provided.

Optionally, the present process can be accomplished with other apparatus or systems described in more detail in commonly assigned US Publication Number 2007/0238311, US Publication Number 2007/0228470, U.S. application Ser. No. 11/620,744, and U.S. application Ser. No. 11/620,740. All these identified applications hereby incorporated by reference in their entirety. These systems attempt to overcome one of the difficult aspects of a spatial ALD system, which is undesired intermixing of the continuously flowing mutually reactive gases. In particular, US Publication Number 2007/0238311 employs a novel transverse flow pattern to prevent intermixing, while U.S. Ser. No. 11/620,744 and U.S. Ser. No. 11/620,740 employ a coating head partially levitated by the pressure of the reactive gases of the process to accomplish improved gas separation. All above-identified applications incorporated by reference in their entirety.

In the embodiments in the latter three applications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (ii) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

As used herein, the term "elongated emissive channels" or "elongated output channels" are each connected to elongated output openings in the output face of a deposition delivery head. The elongated output openings may be formed in the flow outlet of the elongated emissive channels or may be indirectly connected, for example, via a diffuser or other means of effecting the gas flow prior to the elongated output openings.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for material deposition of an organic containing thin-film onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; and (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated emissive channel and each second elongated emissive channel is situated between relatively nearer elongated exhaust channels and between relatively less nearer elongated emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment such a gas diffuser is capable of providing a friction factor for gaseous material passing therethrough that is greater than $1 \times 10^2$, thereby providing back pressure and promoting equalization of pressure where the flow of the at least one first, second and third gaseous material exits the delivery device. In one embodiment of the invention, the gas diffuser comprises a porous material through which the at least one of the first, second, and third gaseous material passes. In a second embodiment of the invention, the gas diffuser comprises a mechanically formed assembly comprising at least two elements comprising interconnected passages, for example, in which nozzles are connected to a flow path provided by a thin space between parallel surface areas in the two elements.

In one embodiment, the one or more of the gas flows from the deposition devices provides a pressure that at least contributes to the separation of the surface of the substrate from the face of the delivery head, thereby providing a "floating head" or "air bearing" type deposition head, which can help to stabilize the gas flows and limit intermixing of the gas flows.

The process of the present invention is advantaged in its capability to perform deposition onto a substrate over a broad range of temperatures, including room or near-room temperature in some embodiments. The process of the present invention can operate in a vacuum environment, but is particularly well suited for operation at or near atmospheric pressure.

The production of thin film electronic devices from the ALD deposited materials can be accomplished by conventional techniques known to the skilled artisan. In one embodiment, a substrate is provided, a film or layer of the material as described above can be applied to the substrate, and electrical contacts made to the layer. The exact process sequence is determined by the structure of the desired electronic device. Techniques for fabricating these structures include selective deposition, sequential masking, photolithography, laser, and/or other means known to the skilled artisan.

A support for supporting the electronic device or layer during manufacturing, testing, and/or use can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). Flexible substrates can also be thin metal foils such as stainless steel provided they are coated with an insulating layer to electrically isolate the thin film transistor. A flexible support, in some embodiments of the present invention, allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself. However, if flexibility is not a concern, then the substrate may be a wafer or sheet made of materials including glass and silicon. The thickness of the substrate may vary, and according to particular examples it can range from about 100 µm to about 1 cm.

As mentioned above, organic materials that can be made using the process of the present invention include, but are not limited to polymers such as alucone, borocone, Bakelite, and polyurethane. Alucone and similar polymers comprise a three dimensional network in the thin film.

Alucone, for example, is an aluminum alkoxide polymer, as described by C. Niamh McMahon et al., in *Chem. Mater.* 1999, 11, 3181-3188, hereby incorporated by reference. McMahon et al. describe tert-bultyl alucones made by reaction between ethylene glycol and Al(tBu)$_3$ precursors to obtain [Al(tBu)$_{2x}$(OCH$_2$CH$_2$O)$_{1.5-x}$]$_n$ (0.3≦2x≦0.8), where "tBu" refers to tert-butyl. Ethoxy alucones can also be made.

Any number of organic or organometallic precursors may be employed in various embodiments of the present process, provided that when a properly treated surface is exposed to a first precursor, a reaction proceeds that leaves moieties on the surface that are reactive to the second precursor. Furthermore, reaction of the second precursor must return the surface to a state which is again susceptible to reaction by the first precursor. Thus, the ALD sequence can be sustained.

In the case where a metal containing precursor is used as one of the reactants, typical compounds would include metal compounds such as trimethyl aluminum, triethyl aluminum, dimethyl zinc, trimethyl zinc, titanium tetrachloride, titanium tetraethoxide, silanes, tetraethoxysilane, as well as any other metal sources which allow rapid reaction.

Alternatively, metals can be delivered in a complexed or reacted form with various compounds, of which beta diketonates are a particularly useful class. The table below shows some representative beta diketonates and other compounds suitable for the production of metal containing precursors.

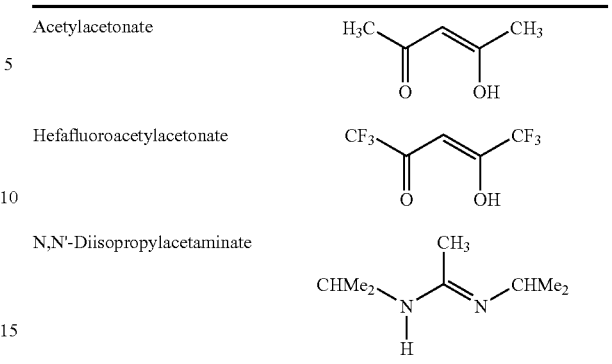

Purely organic precursors (for example, non-metal-containing molecules having at least two carbon atoms and consisting of only covalent bonds), which can be employed in the present process, require at least two active sites to allow for reaction and then subsequent retainment of surface reactivity. Examples of such compounds are diols, such as ethylene glycol, diamines, and dithiols as listed in the table below along with other suitable compounds. Those skilled in the art will recognize that these and other classes of materials can be suitable in the practice of this invention:

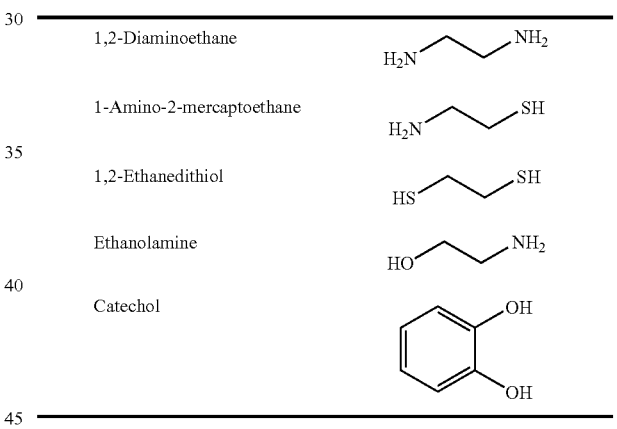

EXAMPLES

Description of the Coating Apparatus

Figure 11:
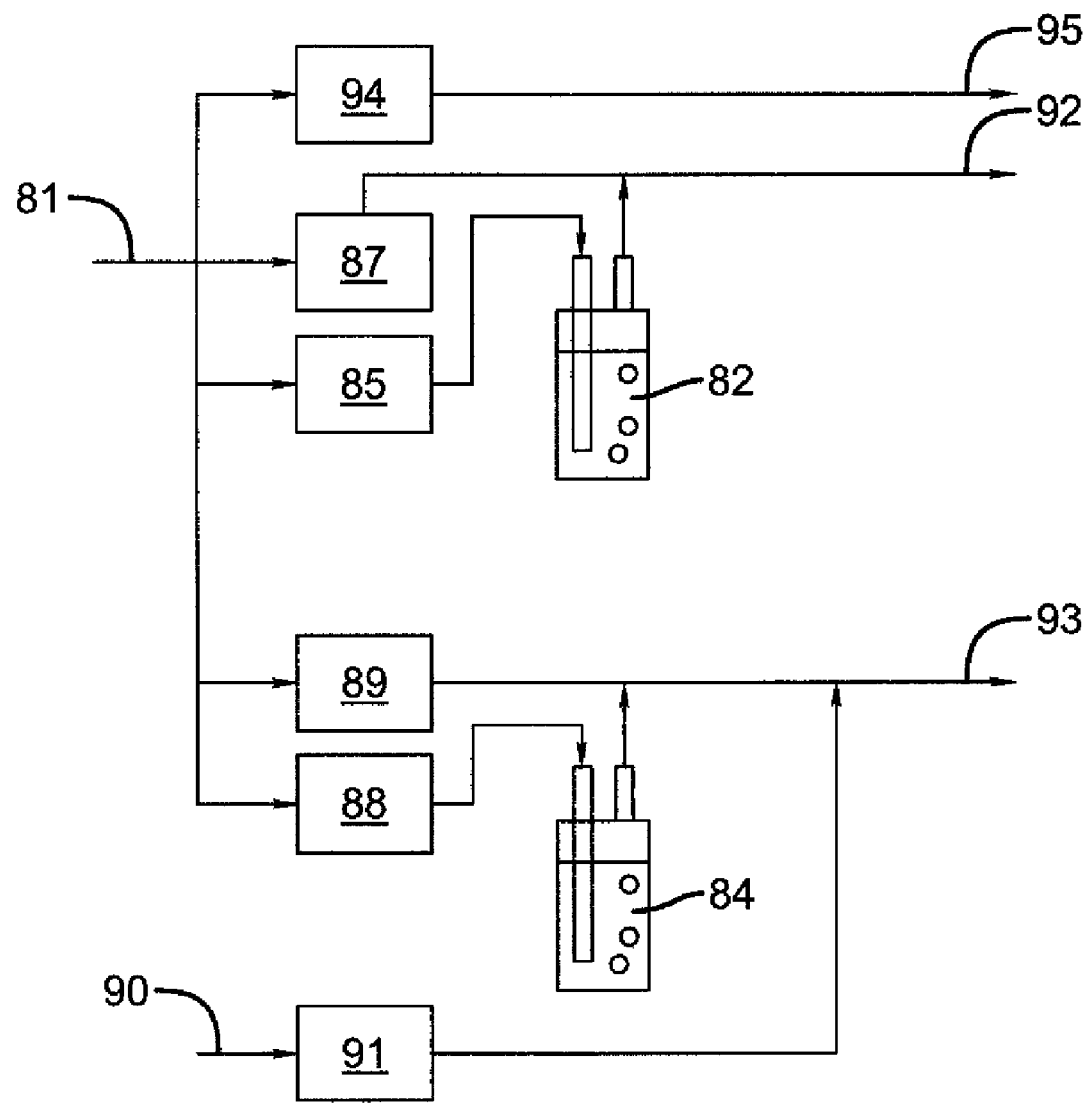
FIG. 11 is a cross-sectional side view of the a deposition device used in the present process, showing the arrangement of gaseous materials provided to a substrate that is subject to thin film deposition process of the Examples.

The coating apparatus used in the present examples is based on the design shown in FIGS. 1 to 7. All of the following thin film examples employ a flow setup as indicated in FIG. 11. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated with molecular sieves to remove moisture.

The following flows are delivered to the ALD coating apparatus: flow 92 containing reactant O1 diluted in nitrogen gas; flow 93 containing reactant O2 diluted in nitrogen gas; nitrogen purge flow 95 composed only of the inert gas. The composition and flows of these streams are controlled as described below.

Gas bubbler 82 contains precursor O2. Flow meter 85 delivers flows of pure nitrogen to the bubbler 82. The output of the bubblers now contains nitrogen gas saturated with the precursor material. These output flows are mixed with a nitrogen gas dilution flow delivered from flow meter 87 to yield the overall flow of metal precursor flow 92.

Gas bubbler 84 contains precursor O1. Flow meter 88 delivers a flow of pure nitrogen to gas bubbler 84, the output of which represents a stream of nitrogen gas saturated with O1 vapor. An airflow 90 is controlled by flow meter 91. The gas bubbler 84 output and nitrogen streams are mixed with dilution stream from flow meter 89 to produce the overall flow of O2 precursor containing gas flow 93.

Flow meter 94 controls the flow of pure nitrogen that is to be delivered to the coating apparatus.

Figure 12:
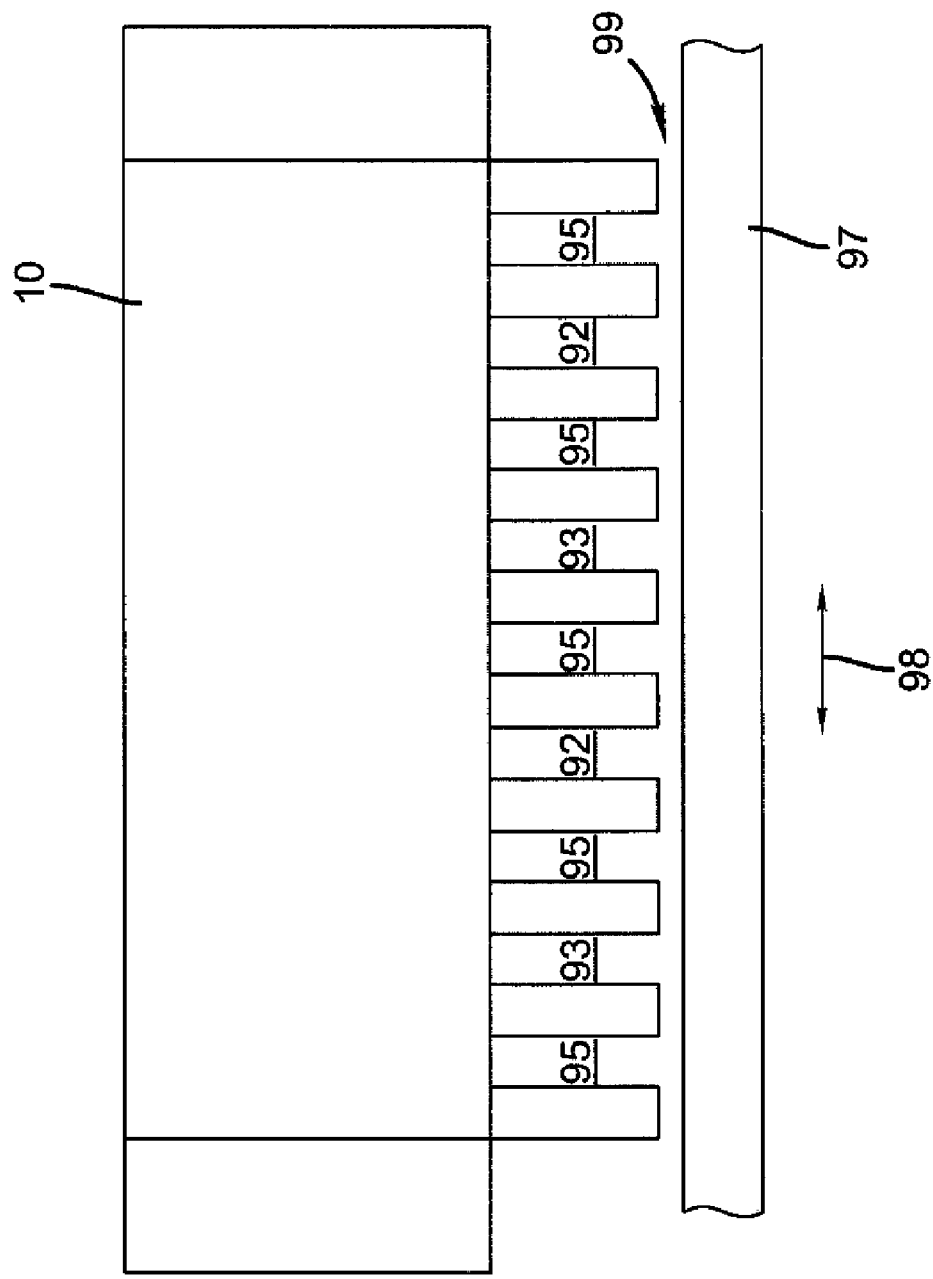
FIG. 12 is a cross-sectional side view of the a deposition device used in the present process, showing the arrangement of gaseous materials provided to a substrate that is subject to thin film deposition process of the Examples.

Streams or Flows 92, 93, and 95 are then delivered to an atmospheric pressure coating head where they are directed out of the channels or microchamber slots as indicated in FIG. 12. A gap 99 of approximately 30 microns exists between the elongated channels and the substrate 97. The microchambers are approximately 2.5 mm tall, 0.86 mm wide, and run the length of the coating head, which is 76 mm. The reactant materials in this configuration are delivered to the middle of the slot and flow out of the front and back.

In order to perform a deposition, the coating head is positioned over a portion of the substrate and then moved in a reciprocating fashion over the substrate, as represented by the arrow 98. The length of the reciprocation cycle was 32 mm. The rate of motion of the reciprocation cycle is 30 mm/sec.

The deposited films were analyzed for composition by Fourier Transform Infrared Spectroscopy (FTIR).

Materials Used:
(1) Polished Silicon substrate
(2) $Me_3Al$ (commercially available from Aldrich Chemical Co.)
(3) Ethylene Glycol (reagent grade, commercially available from Aldrich Chemical Co.)

Example 1

Preparation of Alucone, an Organic-Containing Film

This example describes the preparation of alucone, a thin film containing significant amounts of organic material. For this deposition, bubbler 82 contained trimethylaluminum as the O2 precursor, and bubbler 84 contained ethylene glycol as the O1 precursor.

A 2.5×2.5 inch square (62.5 mm square) Silicon wafer was positioned on the platen of this device, held in place by a vacuum assist and heated to 200° C. The platen with the substrate was positioned under the coating head that directs the flow of the reactive gasses. The spacing between the silicon substrate and the coating head was adjusted using a micrometer to 30 microns.

The coating head was maintained at 40° C. The flow rates of the individual gasses are shown in Table 1 below, the coating process was initiated by oscillating the coating head across the substrate for the number of cycles specified.

The deposited film was analyzed by FTIR. The infrared spectrum of the coating (FIG. 19) indicates the presence of an organic material based on the $v(\text{-}CH_2\text{-})$ hydrocarbon absorbance near 2870 $cm^{-1}$. The peaks at 1088 and 1040 $cm^{-1}$ are also observed in pure ethylene glycol liquid and are assigned to the $v(\text{-}CH_2\text{---}O\text{-})$ linkage. The broad, absorbance observed near 900-700 $cm^{-1}$ is indicative of a $v(Al\text{---}O)$ vibrational mode. The very strong absorption band that is observed at wave numbers of 700 and below is due to the presence of the silicon wafer substrate. It was confirmed by comparison with standard ethylene glycol IR reference spectra (on-line Aldrich Chemical Library) that the absorption peaks observed do not correspond to residual amounts of ethylene glycol, since, for example, the very strong $v(O\text{---}H)$ stretch band in ethylene glycol at 3360 $cm^{-1}$ is absent.

Example 2

Preparation of Borocone

Borocone can be formed using ALD or molecular layer epitaxy. This hypothetical example describes the preparation of borocone, a thin film containing significant amounts of organic material. For this deposition, bubbler 82 contains trimethylborate, $B(OMe)_3$, as the O2 precursor, and bubbler 84 contains ethylene glycol as the O1 precursor.

The device used to prepare borocone is the same device as described in Example 1. A 2.5×2.5 inch square (62.5 mm square) Silicon wafer was positioned on the platen of this device, held in place by a vacuum assist and heated to 200° C. The platen with the substrate was positioned under the coating head that directs the flow of the reactive gasses. The spacing between the silicon substrate and the coating head was adjusted using a micrometer to 30 microns.

The temperature of the coating head is maintained at 40° C. The substrate is maintained at a temperature between 30° C. and 250° C. The desired thickness of borocone can be obtained by controlling the number of oscillation cycles of the head, or the number of ALD cycles seen by the substrate, or the temperature of the substrate. Table 2 contains the flow rates of the individual gases to be used in the coating process for making borocone from trimethylborate and ethylene glycol.

TABLE 2

| Flowmeter 85 | Flowmeter 88 | Flowmeter 87 | Flowmeter 89 | Flowmeter 94 |
|---|---|---|---|---|
| 2 | 100 | 130 | 130 | 750 |

*Flow values in sccm (standard cubic centimeters per minute)

Example 3

Preparation of a Polyurethane

In another hypothetical example of the current invention, thin films of polyurethane can be formed using ALD or

TABLE 1

| Sample | Flowmeter 85 | Flowmeter 88 | Flowmeter 87 | Flowmeter 89 | Flowmeter 94 | Cycles | Substrate Temp., ° C. |
|---|---|---|---|---|---|---|---|
| 1 | 12 | 100 | 130 | 130 | 750 | 1000 | 200 |

*Flow values in sccm (standard cubic centimeters per minute)

molecular layer epitaxy. This example describes the preparation of a polyurethane film, a thin film containing significant amounts of organic material. For this deposition, bubbler 82 contains 1,4-butane diol as the O2 precursor, and bubbler 84 contains 1,4-diisocyanatobutane as the O1 precursor.

The device used to prepare the polyurethane thin film is the device as described in Example 1. A 2.5×2.5 inch square (62.5 mm square) Silicon wafer was positioned on the platen of this device, held in place by a vacuum assist and heated to 200° C. The platen with the substrate was positioned under the coating head that directs the flow of the reactive gasses. The spacing between the silicon substrate and the coating head was adjusted using a micrometer to 30 microns.

The temperature of the coating head is maintained at 40° C. The substrate is maintained at a temperature between 30° C. and 250° C. The desired thickness of polyurethane can be obtained by controlling the number of oscillation cycles of the head, or the number of ALD cycles seen by the substrate, or the temperature of the substrate. Table 2 contains the flow rates of the individual gases to be used in the coating process for making polyurethane from 1,4-butane diol and 1,4-diisocyanatobutane.

TABLE 3

| Flowmeter 85 | Flowmeter 88 | Flowmeter 87 | Flowmeter 89 | Flowmeter 94 |
| --- | --- | --- | --- | --- |
| 100 | 100 | 130 | 130 | 750 |

*Flow values in sccm (standard cubic centimeters per minute)

The invention has been described in detail with particular reference to certain preferred embodiments thereof, but it will be understood that variations and modifications can be effected within the spirit and scope of the invention.

Parts List 1 continuous supply of gaseous materials for system
2 first channel flow of first molecular precursor over channel area of substrate
3 relative movement of substrate and multi-channel flows
4 second channel flow with inert gas over channel area
5 relative movement of substrate and multi-channel flows
6 third channel flow of second molecular precursor over channel area
7 relative movement of substrate and multi-channel flows
8 fourth channel flow with inert gas over channel area
9 relative movement of substrate and multi-channel flow
10 delivery head
11 multiple channel flow in parallel
12 output channel
13 exhaust channels
14, 16, 18 gas inlet port
15 sequence
20 substrate
22 partition
24 gas output port
26 exhaust port
28a, 28b, 28c gas supply
30 actuator
32 supply line
36 output face
50 chamber
52 transport motor
54 transport subsystem
56 control logic processor
58 baffle
60 Atomic Layer Deposition (ALD) process
62 web conveyor
66 web substrate
70 Atomic Layer Deposition (ALD) system
74 substrate support
81 nitrogen gas flow
82, 84 gas bubbler
85, 87, 88 flow meter
89, 91, 94 flow meter
90 air flow
92 metal precursor flow
93 oxidizer-containing flow
95 nitrogen purge flow
96 substrate support
97 example substrate
98 arrow
99 gap
120 ALD
A arrow
D distance
F1, F2 gas flow
$F_I$, $F_O$, $F_M$ gas flow
H height
I inert gaseous material
L channel length
M second reactant gaseous material
O1 first reactant gaseous material
O2 second organic oxidative reactant gaseous material
P product material
R arrow
S1 surface species
W channel width
X arrow

The invention claimed is:

1. A process of making an organic thin film on a substrate by atomic layer deposition, comprising simultaneously directing a series of gas flows along substantially parallel elongated channels, and wherein the series of gas flows comprises, in order, at least a first reactive gaseous material, an inert purge gas, and a second reactive gaseous material, optionally repeated a plurality of times, wherein the first reactive gaseous material is capable of reacting with a substrate surface treated with the second reactive gaseous material and the second reactive gaseous material is capable of reacting with a surface treated with the first reactive gaseous material to form the thin film, wherein the first reactive gaseous material, the second reactive gaseous material or both is a volatile organic compound;

wherein the process is carried out substantially at or above atmospheric pressure, wherein the temperature of the substrate during deposition is under 250° C., and wherein the deposited organic thin film comprises at least 20 atomic weight percent carbon, and wherein the process is carried out in a deposition system comprising:
(a) a plurality of sources for, respectively, a plurality of gaseous materials comprising at least a first, a second, and a third source for a first, a second, and a third gaseous material, respectively;
(b) at least one delivery head for delivering the plurality of gaseous materials to a substrate receiving thin film deposition and comprising:
(i) a plurality of inlet ports comprising at least a first, a second, and a third inlet port for receiving the first, the second, and the third gaseous material, respectively; and (ii) an output face separated a distance from the substrate and comprising a plurality of substantially parallel elongated output openings for each of the first, the second, and the third gaseous materials, wherein the delivery head is designed to deliver the first, the second, and the third gaseous materials simultaneously from the elongated output openings in the output face.

2. The process of claim 1 wherein the first reactive gaseous material comprises a metal or metalloid atom.

3. The process of claim 2 wherein the first reactive gaseous material comprises a metal or metalloid atom bonded to carbon, nitrogen, oxygen, or hydrogen.

4. The process of claim 2 wherein the metal or metalloid atom is selected from the group consisting of aluminum, zinc, titanium, and silicon.

5. The process of claim 2 wherein the metal or metalloid atom is in association with a beta-diketonate compound.

6. The process of claim 1 wherein the second reactive gaseous material comprises one or more functional groups selected from the group consisting of hydroxyl groups, thiol groups, and amine groups.

7. The process of claim 1 where the second reactive compound is selected from the group consisting of diols, dithiols, diamines, and quinolinates.

8. The process of claim 1 wherein the organic thin film is an inorganic-organic hybrid thin film.

9. The process of claim 1 wherein the series of gas flows are provided by a deposition device comprising, facing the substrate in plan view, a series of open elongated output openings, substantially in parallel, positioned over the substrate in close proximity thereto, in an output face of the deposition device, the output face spaced within 1 mm from the substrate surface subjected to deposition, wherein optionally there are no exhaust channels between elongated output channels for the first reactive gaseous material and the second reactive gaseous material.

10. The process of claim 1 wherein at least part of a force maintaining a separation between the output face of the delivery head and the substrate surface during thin film deposition is generated due to flows of one or more of the gaseous materials from the delivery head to the substrate surface for thin film deposition and wherein the deposition device further comprises exhaust channels between elongated substantially parallel output openings for the at least the first and the second reactive gaseous materials.

11. The process of claim 1 wherein a given area of the substrate is exposed to a gas flow in a channel for less than 100 milliseconds and wherein relative movement of the substrate to a deposition device is at a speed at least 0.1 cm/sec.

12. The process of claim 1 wherein the volatile compounds can be vaporized at a temperature under 300° C. at atmospheric pressure.

13. The process of claim 1 wherein a total surface area of the substrate for thin-film material deposition exceeds a total surface area of the output face of the deposition device.

14. The process of claim 1 wherein the substrate or a support for the substrate comprises a moving web.

15. The process of claim 1 wherein the process is in unsealed relationship to ambient atmosphere.

16. The process of claim 1 wherein the process is used to make an insulating layer of an electronic device containing said insulating layer disposed between at least two conductive electrodes.

17. The process of claim 1 wherein the process is used to make a barrier layer protecting an electronic device from its surrounding atmosphere.

18. The process of claim 1 further comprising a substrate support that maintains a surface of the substrate at a separation distance of within 0.3 mm of an output face of a deposition device.

19. The process of claim 17 wherein the electronic device is selected from a group consisting of an integrated circuit, active-matrix display, solar cell, active-matrix imager, sensor, and rf price, identification, or inventory label.

* * * * *